United States Patent
Randhawa

(10) Patent No.: US 10,179,351 B2
(45) Date of Patent: Jan. 15, 2019

(54) METHOD AND APPARATUS FOR CLEANING FLAT OBJECTS WITH PULSED LIQUID JET

(75) Inventor: Rubinder Randhawa, Fremont, CA (US)

(73) Assignee: Planar Semiconductor, Inc., Milpitas, CA (US)

( * ) Notice: Subject to any disclaimer, the term of this patent is extended or adjusted under 35 U.S.C. 154(b) by 2220 days.

(21) Appl. No.: 11/299,134

(22) Filed: Dec. 12, 2005

(65) Prior Publication Data

US 2006/0174920 A1      Aug. 10, 2006

Related U.S. Application Data

(60) Provisional application No. 60/650,572, filed on Feb. 7, 2005.

(51) Int. Cl.
*B05B 1/04* (2006.01)
*B08B 3/02* (2006.01)
(Continued)

(52) U.S. Cl.
CPC .............. *B08B 3/024* (2013.01); *B05B 1/044* (2013.01); *B05B 1/06* (2013.01); *B05B 1/341* (2013.01);
(Continued)

(58) Field of Classification Search
CPC ....................................................... B05B 1/044
See application file for complete search history.

(56) References Cited

U.S. PATENT DOCUMENTS 1,902,202 A * 3/1933 Vawter .......................... 239/590
5,468,302 A   11/1995 Thietje
(Continued)

FOREIGN PATENT DOCUMENTS

JP    S62-173718    7/1987
JP    2004-281429   10/2004

OTHER PUBLICATIONS

"Demonstrating a contamination-free wafer extraction system for use with CE and IC" by Peng Sun, et al. (http://www.micromagazine.com/archieve/99/04/sun.html).
(Continued)

*Primary Examiner* — Jason Y Ko
(74) *Attorney, Agent, or Firm* — Schwegman Lundberg & Woessner, P.A.

(57) ABSTRACT

A method and apparatus for pulsed jet cleaning of flat objects based on the principle of enhancing formation of droplets of the cleaning medium by increasing the boundary surface area between the jets emitted though the nozzles of the cleaning unit and the surrounding atmosphere. In various embodiments of the invention, these droplet formation enhancement means are located inside the nozzle at the nozzle outlet end and are made in the form of a jet splitter, threaded grooves on the inner surface of the nozzle body, or in the form of a thin tube for the supply of gas into the flow of the liquid cleaning medium for the formation of gas bubbles in the medium. The method also takes into account such factors as a mass ratio between the droplets and the contaminant particles, velocity of droplets, organization and sequence of jets that attacks the surface of the wafer and flows that wash-out the separated particles, etc.

14 Claims, 9 Drawing Sheets

(51) Int. Cl.
*B05B 1/06* (2006.01)
*B05B 1/34* (2006.01)
*B05B 7/04* (2006.01)
*B05B 12/02* (2006.01)
*B05B 13/04* (2006.01)
*H01L 21/67* (2006.01)

(52) U.S. Cl.
CPC ............ *B05B 7/0433* (2013.01); *B05B 12/02* (2013.01); *B05B 13/0405* (2013.01); *B05B 13/0442* (2013.01); *H01L 21/67051* (2013.01)

(56) References Cited

U.S. PATENT DOCUMENTS

| | | | |
|---|---|---|---|
| 5,800,867 A * | 9/1998 | Matsunaga et al. | 427/476 |
| 6,357,483 B1 * | 3/2002 | Kobayashi | 138/40 |
| 6,363,623 B1 | 4/2002 | Abraham | |
| 6,866,723 B2 | 3/2005 | Ueda et al. | |
| 9,799,536 B2 | 10/2017 | Randhawa | |
| 2002/0166569 A1 | 11/2002 | Harvey et al. | |
| 2003/0029479 A1 | 2/2003 | Asano | |
| 2003/0079762 A1 | 5/2003 | Husain et al. | |
| 2004/0235308 A1 * | 11/2004 | Sato et al. | 438/704 |

OTHER PUBLICATIONS

"U.S. Appl. No. 11/269,250, Advisory Action dated Jul. 1, 2016", 3 pgs.

"U.S. Appl. No. 11/269,250, Decision on Pre-Appeal Brief Request dated Sep. 20, 2017", 2 pgs.

"U.S. Appl. No. 11/269,250, Examiner Interview Summary dated Jul. 11, 2016", 3 pgs.

"U.S. Appl. No. 11/269,250, Final Office Action dated Mar. 22, 2017", 18 pgs.

"U.S. Appl. No. 11/269,250, Final Office Action dated Mar. 31, 2016", 18 pgs.

"U.S. Appl. No. 11/269,250, Non Final Office Action dated Aug. 27, 2015", 17 Pgs.

"U.S. Appl. No. 11/269,250, Non Final Office Action dated Sep. 7, 2016", 17 pgs

"U.S. Appl. No. 11/269,250, Notice of Allowability dated Sep. 22, 2017", 2 pgs.

"U.S. Appl. No. 11/269,250, Notice of Allowance dated Sep. 7, 2017", 10 pgs.

"U.S. Appl. No. 11/269,250, Pre-Appeal Brief Request filed May 19, 2017", 5 pgs.

"U.S. Appl. No. 11/269,250, Response filed Jan. 15, 2015 to Final Office Action dated Feb. 25, 2009", 15 pgs.

"U.S. Appl. No. 11/269,250, Response filed Jan. 27, 2016 to Non Final Office Action dated Aug. 27, 2015", 14 pgs.

"U.S. Appl. No. 11/269,250, Response filed May 31, 2016 to Final Office Action dated Mar. 31, 2016", 14 pgs.

"U.S. Appl. No. 11/269,250, Response filed Dec. 7, 2016 to Non Final Office Action dated Sep. 7, 2016", 15 pgs.

Janani, Mehran, et al., "Rapid Pulse Harmonic Spray Technology (R-PHAST)—A Novel technique for wafer cleaning and lift-off applications for GaAs manufacturing", (Dec. 2004), 7 pgs.

\* cited by examiner

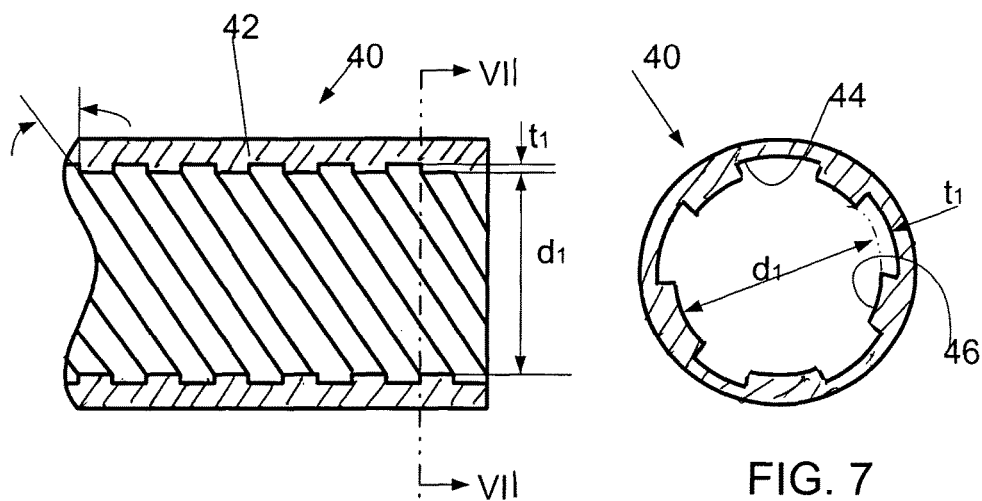
FIG. 6
FIG. 7
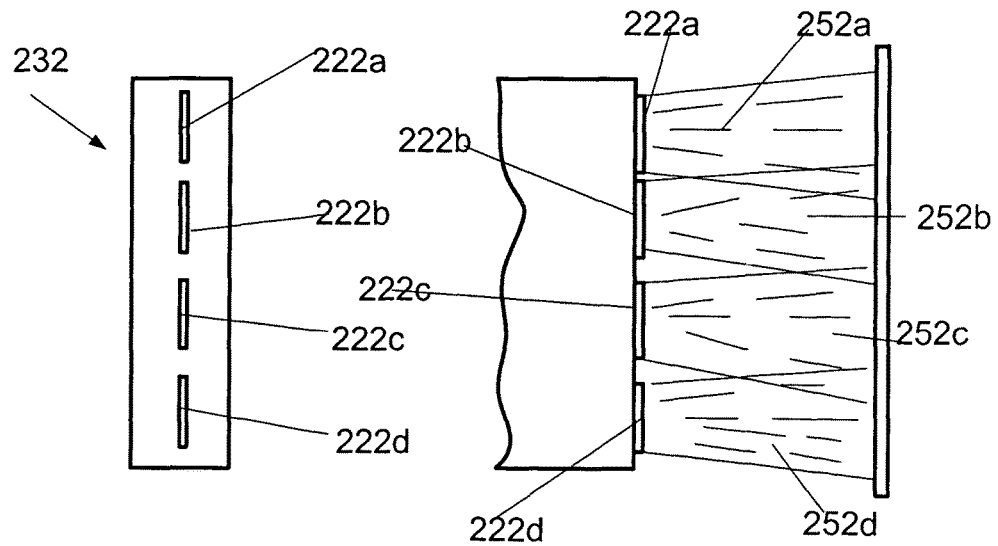
FIG. 11
FIG. 12

METHOD AND APPARATUS FOR CLEANING FLAT OBJECTS WITH PULSED LIQUID JET

CROSS-REFERENCES TO RELATED APPLICATIONS

The present patent application is related to provisional U.S. Patent Application No. 60/650,572 filed by R. S. Randhawa on Feb. 7, 2005, entitled "Vertical Rapid Pulse Spin Processing of Semiconductor Wafers for Wet Clean Application" on which the present application is based upon and to U.S. patent application Ser. No. 11/269,250, now issued as U.S. Pat. No. 9,799,536, filed by R. S. Randhawa on Nov. 9, 2005, and entitled, "Apparatus and Method for Cleaning Flat Objects in a Vertical Orientation with Pulsed Liquid Jet".

FIELD OF THE INVENTION

The present invention relates to the field of cleaning of flat objects, in particular to wet cleaning of semiconductor wafers in the process of their production.

DESCRIPTION OF THE PRIOR ART

Cleaning of surfaces of wafer substrates is one of the most important steps in the fabrication of semiconductor microelectronic devices. It is well known that the presence of chemical contaminants and particles of impurities may significantly reduce the yield of the products and noticeably affect the performance and reliability of the produced semiconductor devices.

In view of the present trend in the semiconductor industry that go far beyond the submicron sizes of the device features, the effective techniques for cleaning silicon wafers, e.g., initially and after oxidation and patterning, are now more important than ever before because of the extreme sensitivity of the semiconductor surfaces to the presence of contaminants. Specifically, total metallic impurities should be far less than $10^{10}$ atoms per $cm^2$. Presence of particles larger than 0.1 μm in size should be much less than approximately 0.1 per $cm^2$. This means that particles, e.g., on the 200 mm wafer, may be considered as a threshold of cleanliness.

In view of the fact that the above criteria are very stringent, the efficiency of the equipment and processes used for wafer cleaning should be evaluated from the point of view of satisfaction of the above requirements in the treated wafers.

There exist a plurality of various methods and processes for wafer cleaning that roughly can be subdivided into dry-physical, wet-physical, combined wet physical/chemical, vapor-phase methods, etc. Furthermore, there exists a series of apparatuses for implementing the aforementioned cleaning processes in the industry.

In a majority of cases, the cleaning processes are oriented specifically on silicon since this material is a basis for fabrication of integrated circuits.

The present invention pertains to the aforementioned wet-physical and combined wet physical/chemical processes, which are most widely used for cleaning of semiconductor wafers. The wet cleaning methods and apparatuses, in turn, have a plurality of different implementations with vertical or horizontal orientation of single or multiple wafers performing different specific movements during the cleaning cycle, the use of different cleaning media and tools, the use of different methods for drying, etc.

For example U.S. Pat. No. 5,468,302 filed by J. Thietje on Nov. 21, 1995, entitled "Semiconductor Wafer Cleaning System" relates to a semiconductor wafer cleaning system for cleaning semiconductor wafers intended for circuitry in small geometric structures of 0.3 μm or less. The apparatus includes successively arranged wafer loading, washing, drying, and unloading stations, each having an individual closable enclosure. Also included in the apparatus is a device for storing a number of wafers in a vertical plane within the enclosures of the loading and unloading stations, a device for transporting a sequence of individual wafers, a device for rotating the wafers and a high pressure jet for simultaneously cleaning opposite surfaces of the wafers.

An advantage of the cleaning system of U.S. Pat. No. 5,468,302 consists of vertical arrangement of the wafers that improves contamination removal conditions. However, the use of continuous jets of a washing liquid emitted onto a vertically oriented surface of a rotating flat object, such as a semiconductor wafer, appeared to be insufficient for removal of particles of contaminant having dimensions close to 0.3 μm or less.

U.S. Pat. No. 6,866,723 to Takeji Ueda, et al. issued on Mar. 15, 2005 describes a wet cleaning process and wet cleaning equipment. A substrate is treated with a desired liquid while revolving the substrate around an axis of rotation outside the substrate such that the liquid flowing on a surface of the substrate is maintained flowing under a centrifugal force greater than gravitation. The substrate is treated while supplying the liquid at a flow rate at least equal to a discharge rate of the liquid only in a direction conforming with that of the centrifugal force or with that of a flow of the liquid flowing on the surface of the substrate under the centrifugal force. The substrate surface is evenly treated with the liquid while avoiding flows of the liquid running against each other or a flow of the liquid stagnating on the surface of the substrate. A main disadvantage of the system is horizontal orientation of the wafers during treatment that does not provide efficient removal of very small contamination particles, such as those having dimensions of about 0.3 μm or less from the upper face of the wafer.

Japanese Laid-Open Patent Application Publication No. 2004-281429 published on Oct. 7, 2004 to H. Nobata relates to a wet cleaning device that can be improved further in cleaning effect by satisfactorily removing foreign matters by utilizing a liquid flow discharged by means of a centrifugal force without inhibiting the liquid flow. The device is provided with a nozzle of a special configuration used for wet cleaning by jetting a pressurized cleaning fluid upon the surface of the rotating wafer that alternates with a gaseous jet cleaning through the same nozzle from a separate gas source. The wafer has a horizontal orientation with inherent disadvantages, while the use of gaseous and liquid fluids supplied through the same nozzle demands implementation of a complicated fluid distribution and sealing system. However, the apparatus of the aforementioned invention is still incapable of removing contaminant particles of very small dimensions. Furthermore, when the cleaning system has a horizontal orientation of the wafers, problems always occur in the cleaning apparatus in view of dripping of drops of condensate from the upper wall of the closed processing chamber onto the upper face of the wafer that has been cleaned but is still located in the processing chamber.

Attempts have been made so far to improve efficiency of wet wafer cleaning by improving modes of operation, e.g., by multiple repetition of the cleaning cycle. An example of such an improvement is described in Japanese Laid-Open Patent Application Publication No. S62-173,718 published on Jul. 30, 1987 to T. Iwata. In this device, a semiconductor wafer is rotated at constant speed by a chuck. A pulse signal having predetermined device characteristics is transmitted over a stepping motor, and a cleaning fluid such as pressurized water or the like is sprayed against the surface of the wafer, while a nozzle of cleaning fluid is moved slowly in the peripheral section of the wafer and shifted fast with an approach to the central section of the revolution of the wafer. Consequently, the cleaning fluid in uniform quantity is sprayed against the whole surface of the wafer. The working cycle consists of two or more half-periods of swinging of the pivotal nozzle across the wafer surface. In other words, in the above-described system, the cleaning liquid is discharged from the nozzle at a constant speed of flow while the nozzle itself moves across the wafer with a variable speed, e.g., with a speed that is higher at the wafer center where points on the wafer surfaces rotate with the minimal linear speed on the wafer surface and with a speed lower at the wafer edges where points on the wafer surface have high linear speed. This means that the system provides more uniform flow rate of the cleaning liquid over a unit of the surface area of the wafer. Nevertheless, the problem associated with removal of very small particles of contaminants, e.g., of less than 0.1 µm, remained unsolved.

Attempts have been made to apply to the wafer cleaning problem a new approach. An example of such an approach is development of a rapid-pulse harmonic spray technology developed by the applicant and described by Mehran Janani, et al. in article "A novel approach to metal lift-off for GaAs ICs" (see the Internet address: (http://www.compoundsemiconductor.net/articles/magazine/9/10/3/1).

The fluid droplets in each pulse interact with the wafer, which rotates slowly in a vertical orientation, to produce a hybrid of laminar and turbulent flow types. Rapid pulsing controls the fluid-mechanical interactions of jets and droplets with any adsorbed contaminants. As a result, the chemical concentration gradient at the wafer/liquid interface is always positioned to favor desorption of contaminants. The moderate application of a pressurized solvent allows for a blend of mechanical and chemical energy for lift-off applications. Large particles are removed at the point of impact of the pulse spray due to the generation of turbulent flow. In the laminar flow regime where the boundary layer is less than 1 µm, the solvent is responsible for dispersing and rinsing small particles and labile layer removal. Compared with the use of other technologies that use fluids at super critical pressures aided with co-solvents, dry $CO_2$/liquid approaches and jet sprays, the rapid pulse approach manipulates all of the essential thermal, mechanical, and chemical ingredients for effective cleaning, thereby offering a simple, elegant and cost-effective solution.

Although the above-described rapid-pulse harmonic spray method and apparatus have considerably improved efficiency of cleaning, they are still insufficiently effective for removal of contaminant particles having dimensions of the order of 0.1 µm or less.

SUMMARY OF THE INVENTION

The method and apparatus of the invention relate to wet cleaning of flat objects, such as semiconductor wafers, from contaminants with the use of a cleaning medium ejected from a system of nozzles in the form of pulsed jets and impinged onto the surface of the wafer in the form of droplets having controlled kinetic energy and dimensions. It is another object to provide the nozzles with droplet initiation means. It is still another object to provide a cleaning unit for flat objects with nozzles operating in a controllable mode that ensures most efficient removal of particles of contaminant as small as 0.1 µm or smaller. It is another object to provide a cleaning unit and a method of cleaning flat objects, e.g., semiconductor wafers, with different types of nozzles for separating contaminant particles and for washing out the separated particles from the wafer, respectively.

The above objects are achieved by providing the nozzles with special means for enhancing formation of medium droplets. In various embodiments of the invention, these droplet-formation enhancement means are located inside the nozzle at the nozzle outlet end and are made in the form of a jet splitter, threaded grooves on the inner surface of the nozzle body, or in the form of a thin tube for the supply of gas into the flow of the liquid cleaning medium for the formation of gas bubbles in the medium. The method and the apparatus of the invention are based on the principle that the use of the aforementioned droplet-formation enhancement means increases the boundary surface between the liquid medium and the surrounding gaseous atmosphere and thus produces an increased amount of droplets. The efficiency of the cleaning operation is improved by combining the aforementioned controlled droplet-formation mechanism with a pulsed nature of the emitted jet. The method also takes into account such factors as a mass ratio between the droplets and the contaminant particles, velocity of droplets, organization and sequence of jets that attack the surface of the wafer and flows that wash-out the separated particles, etc.

The cleaning unit is intended for operation in a closed cleaning chamber located preferably in a pure and controllable environment. The unit contains a stationary nozzle array composed of a plurality of the aforementioned nozzles that may be positioned on both sides of the vertically oriented objects, e.g., a semiconductor wafer, for cleaning the front and back surfaces of the wafer simultaneously. The nozzles operate in a rapid pulse harmonic spray mode with the formation of pulsed fluid streams of discrete droplets injected onto the wafer surface. The droplets have a specific size that matches the size and type of the contaminant particles. The jets are created by means of an electrical three-diaphragm short piston pumps (not shown) and may be combined with specially selected chemistry. The apparatus may be provided with reservoirs for different cleaning media and with a heater and a cooler for heating and cooling of cleaning liquids with reference to the used chemicals and other operation conditions. Rapid pulsed streams of chemistry and cleaning liquids are fired in timed succession controlled from a central processing unit. Some embodiments provide the use of additional laminar-flow nozzles for removal of the contaminant particles separated by turbulent pulsed streams. The pulsed jet cleaning liquid and the washing liquid can be supplied at different temperatures selected with reference to specific operation requirements.

BRIEF DESCRIPTION OF THE DRAWINGS

FIG. 6 is a longitudinal cross-sectional view of a nozzle of another embodiment with helical grooves on the inner surface of the nozzle.

FIG. 7 is a cross-sectional view along line VII-VII in FIG. 6.

FIG. 11 is a front view of the nozzle head of the invention with slit-like nozzles.

FIG. 12 is a side view of the nozzle head of FIG. 11.

DETAILED DESCRIPTION OF THE INVENTION

For better understanding the principle of the present invention, let us first consider some theoretical fundamentals of a jet emitted from the orifice of a nozzle. A jet can be defined as a form of a flow of a fluid that is emitted into a surrounding space filled with a fluid (liquid or gas) having parameters (velocity, temperature, density, composition, etc.) different from those of the emitted fluid. In an approximated model of flow of an ideal liquid, the boundary of the jet is a surface of a tangential discontinuity, and the substance of the jet is not mixed with the substance of the surrounding space.

One can find a great variety of forms of jets used in various devices and apparatuses, e.g., jets emitted from the nozzles of a missile, ejectors, spray guns, as well as jet flows in the atmosphere, etc. Therefore, the jets are normally classified according to their essential features.

Jets emitted from nozzles or orifices find the most wide practical application. Depending on the shape of the cross section of nozzles or orifices, the jets may be round, square, flat, while depending on the direction and velocity of the flow at the nozzle exit, the jets may be axial, fan-like, or twisted. In terms of the properties of the substance, the jets may consist of droplets. Two-phase jets, e.g., jets of a liquid filled with gas bubble are classified as jets of a special class.

Depending on physical properties of the jet-forming substances and the external medium, the jets may be non-mixable, e.g., jets of water emitted to the atmosphere. The surface of a non-mixable jet is unstable, and at a certain distance from the nozzle exit the jet is disintegrated into droplets. The distance at which such a jet preserves its continuity depends on physical properties of the jet substance, kinetic energy, and a level of initial disturbances in the nozzle.

Figure 1:
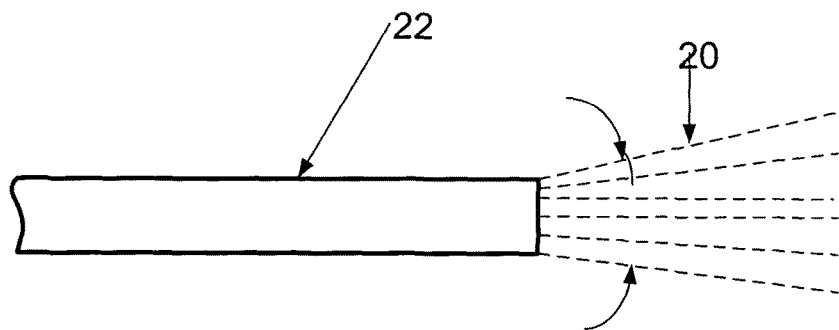
FIG. 1 is a view of a theoretical turbulent jet of a fluid ejected from the end of a thin tube and propagating through an endless space filled with the same fluid.

Let us consider a theoretical case of a turbulent jet 20 ejected from the end of a thin tube 22 and propagating through an endless space filled with the same liquid. At distances essentially greater than the diameter of the tube the jet is axially symmetric irrespective of the shape of the opening (FIG. 1).

Turbulence can be defined as a complex, orderless motion of substance non-repeatable in small increments of time and space.

For determining the outlines of the field where movement of the jet is turbulent, let us assume that the jet axis is axis "x", and let us designate the turbulent field radius as R. As has been mentioned above, at distances greater than the tube diameter, the shape of the jet does not depend on the shape and dimensions of the jet outlet opening. As in this case the jet cannot be characterized by any units of length, it is understood that R should be proportional to "x", where "x" is counted from the jet exit point. This relationship can be expressed as follows:

$$R = \tan\alpha \cdot x \tag{1}$$

where the numerical constant $\tan\alpha$ is the same for all jets. Thus, the field of turbulent movement can be presented as a cone. Experiments show that the divergence angle $2\alpha$ of this cone is about 25°. In the jet, movement occurs predominantly along its axis. Since any units of length or velocity that could be used for characterizing movement in the jet are absent, distribution of the longitudinal velocity "u" (averaged over time) in the jet can be expressed via the following equation:

$$u_x(r,x) = u_0(x) f[r/R(x)], \tag{2}$$

where "r" is a distance from the jet axis in the transverse direction and "$u_0$" is the velocity on the jet axis.

Effect on distance "x" from the jet velocity can be determined as follows. A complete pulse flow in a jet through a spherical surface (with the center at the point of jet exit) must remain constant irrespective of the jet radius. Density of the pulse flow in a jet is $\sim\rho u^2$, where "u" is an order of a certain average velocity in the jet. The area of the cross section in the part of the jet where the velocity is essentially different from 0 is of the order of $R^2$. Therefore the complete pulse flow P is $\sim\rho u^2/R^2$. By incorporating equation (1), this expression can be written as follows:

$$u \sim (P/\rho)^{1/2}(1/x) \tag{3}$$

Thus, it can be concluded that the velocity drops in an inverse proportion to the distance from the jet exit point.

Keeping the above in mind, it can be understood that a jet is of an unstable nature and that during its movement in the axial direction it is subject to tangential discontinuities at a certain distance from the point of exit. These discontinuities lead to formation of droplets.

The applicant has developed a method and device of the invention that make it possible to form the aforementioned droplets with a mass that is comparable with the mass of microparticles to be removed from the surface of the flat object. This is because such a relationship between the masses of the droplets and contaminant particles provides most efficient conditions for particle lift-off, especially at collisions of the droplets with the still dry wafer surface when the cleaning process is started. In other words, if a particle has dimension of 0.1 μm, it can be more efficiently removed when it is still dry and collides with the droplet of the mass comparable with that of the particle. The applicant considers that since the droplet has been accelerated to a certain velocity, at the instance of collision with the contaminant particle it generates a pulse MV that transfers to the particle a non-elastic impact that efficiently removes the particle.

As has been mentioned above with reference to formula (3), the velocity of the droplet drops proportional to 1/x. Therefore, it is important to disintegrate the jet into fine drops and to provide these droplets with velocity sufficient for particle lift-off.

It should be noted that the assumptions given above with reference to some basic formulas were related to the case of emission of a jet of a fluid from a nozzle into another volume of the same fluid. Therefore emission of one fluid through a nozzle into a medium of a different type or phase, e.g., of liquid into gas, will be much more complicated, although in general the scenario will be essentially similar.

In fact, the velocity of the fluid in the jet will be maximal in the center of the jet because of the viscous fiction of the peripheral areas of the jet over the inner surface of the nozzle. Therefore it can be assumed that turbulence, discontinuation of the medium, and hence the droplet-formation mechanism will have a more intensive nature in the center of the emitted jet with gradual propagation of the droplet-formation mechanism towards the peripheral areas of the jet. Another important requirement for efficient removal of contaminant particles from the surface of the object is to provide formation of droplets having masses approximately equal to those of the particles. A third requirement is to impart to the droplets a sufficient kinetic energy.

Another important factor in the wet-cleaning mechanism is a problem of wettability. It is understood that particles to be removed and the surface contaminated by these particles may be of a different nature. For example, normally a wafer is made of silicon that is coated with a very thin layer of silicon oxide (several tens of Angstroms). Particles may be of metal, metal oxide, polymer, etc. It is understood that the materials of the object and particles have different wettability with the cleaning medium. Therefore cleaning of the object from wettable and non-wettable particles and vice verse may require selection of different cleaning media and different designs of cleaning unit components.

The inventors herein arrived to the present invention on the basis of the above-described findings.

It is understood that in reality the particles may have different dimensions, but the main interest is drawn to particles of the order of 0.1 μm or less as they are most difficult to remove. Such microparticles are held by forces of two types, i.e., a) non-charged particles are held by van der Waals forces, the potential of which is proportional to $1/r^{6-8}$, where r is a distance between the mass center of a particle and the surface; b) charged particles are held, e.g., on the substrate surface of Si where a thin SiO layer exists between the Si and the particle, by Coulomb forces having potential proportional to $1/r_1$, where $r_1$ is a distance of an electric field from a single point charge. It is understood that particles of type b) are more difficult to remove.

In the applicants opinion the most efficient mechanism of particle removal may be achieved when the droplets emitted from the nozzle in a pulsed-jet mode have masses substantially comparable with the masses of the target particles and possess kinetic energy sufficient to separate particles from the surface of the wafer at the starting point of the process when the surface is still dry and is attacked by the first front of the moving droplets. It is understood that liquid droplets may transfer energy to dry particles only in a non-elastic mode. When a non-elastic impact is transferred from a droplet to a particle that is supported by a surface having a high rigidity constant, the particle begins to oscillate in the impact direction under effect of an impact component acting in the direction perpendicular to the surface of the substrate that holds the particle. In wet cleaning, these oscillations facilitate removal of the particles by means of an oncoming flow of a cleaning liquid that is formed during rotation of the substrate.

As has been mentioned above, particles of the contaminants and a material of the object may have different wettability with the cleaning medium. It is understood that the aforementioned process of particle oscillation will be different in situations when the particles are wetted with the droplets while the surface of the object is non-wetted, and when the particles are not wetted while the object surface is wetted. In the former case the particle oscillation process will more strongly depend on viscous friction of particles in the medium of the droplet. Many other scenarios can be considered in this connection.

The applicant has revealed that microscopic particles that are most difficult to remove can be removed more efficiently if the elements of the above-described model of the particle removal mechanism are incorporated into a pulsed liquid jet.

More specifically, provisions of the above-described theory with regard to most efficient geometry and droplet formation conditions are complemented and enhanced by the mechanism of a pulsed jet which is the following.

The rapid pulse harmonic spray technology relies on firing in rapid succession of a pulsed train of fluid droplets that cause a hybrid fluid flow at the substrate jet interface. The hybrid fluid flow produced due to the rapid pulse technique causes the creation of turbulent and laminar flow at the same time, where the turbulent flow is responsible mainly for separation of the particles, while both the laminar flow and the turbulent flow are responsible for washing the particles out from the object. Rapid pulsing also results in weakening the already thin boundary layer produced due to the vertical rotation of the substrate. With minor adjustment the rapid pulsed jets can be adjusted to clean the edges of the wafer only. A different nozzle may be used for just the bevel cleaning of the wafers.

The pulsed train of discreet droplets is able to remove the contaminants in a continuous way without propagating enough energy as in the case of straight jets to destroy the features on the wafer surface. Each pulse produces a finite number of discreet droplets and with the wafer rotating vertically the pulse train maintains a thin boundary layer that is effective to remove contaminants.

Based on the above knowledge and findings, the applicant has developed a novel method and apparatus for cleaning flat objects in a vertical orientation with pulsed liquid jets.

Figure 2:
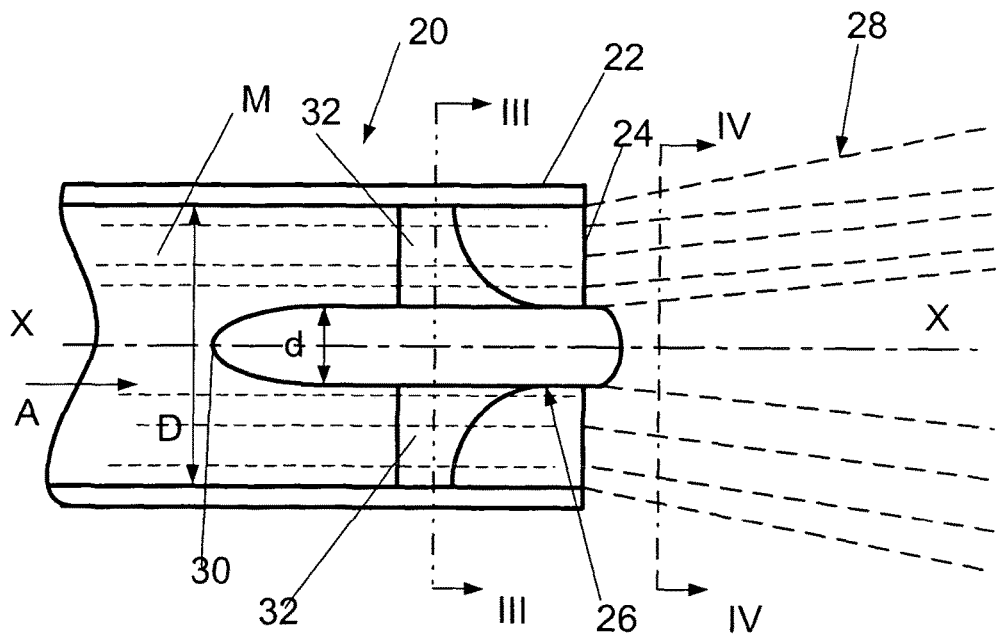
FIG. 2 is a longitudinal sectional view of the outlet end of a nozzle made in accordance with one embodiment of the invention.
Figure 3:
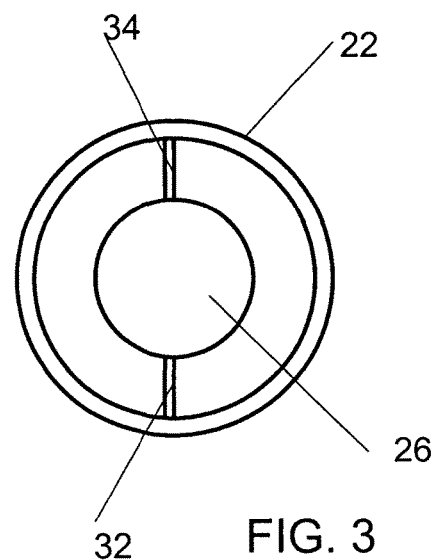
FIG. 3 is a cross-sectional view along line II-II of FIG. 2.

FIG. 2 is a longitudinal sectional view of the outlet end of a nozzle made in accordance with one embodiment of the invention for cleaning flat objects in a vertical orientation with a pulsed liquid jet. FIG. 3 is a cross-sectional view along line II-II of FIG. 2, and FIG. 4 is a cross-sectional view of a jet 28 along line III-III of FIG. 2 at a distance from the jet exit.

As shown in FIG. 2, the outlet end of a nozzle 20 for the cleaning installation of the present invention is comprised of a tubular outer portion 22 with a jet exit opening 24 and an inner portion formed by a jet splitter 26 that has a diameter "d" smaller than the inner diameter D of the tubular outer portion and that is arranged concentrically inside the tubular outer portion 22 along the longitudinal axis X-X of the nozzle 20. As can be seen from FIG. 2 that in the longitudinal direction the jet splitter 26 has a bullet-like shape with a sharp end 30 directed opposite to the direction of the fluid flow shown by arrow A in FIG. 2. The jet splitter 26 is held in the central position inside the tubular outer portion 22 by a pair of thin diametrically opposite ribs 32 and 34 (FIGS. 2 and 3). It is understood that two ribs are shown as an example, and the number of ribs may be different, e.g., one, three, or more. The ribs 32 and 34 have a thickness designated by "t".

Figure 4:
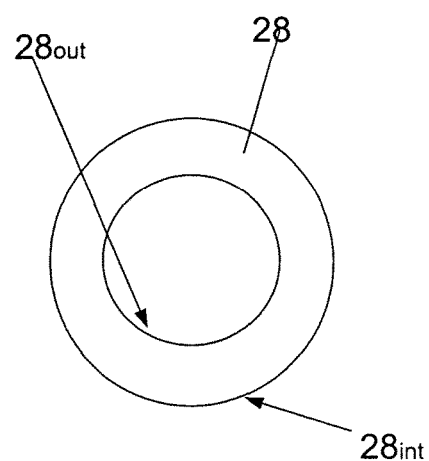
FIG. 4 is a cross-sectional view of a jet along line III-III of FIG. 2 at a distance from the jet exit.

It can be seen from FIG. 4 that at a distance close to the edge of the jet exit opening 24 where the jet 28 has not been yet disintegrated into individual droplets the jet has an annular shape with an inner surface $28_{int}$ and an outer surface $28_{ext}$ that form boundaries with the surrounding gaseous atmosphere. As compared to a jet having a continuous round cross section, the annular shape of the type shown in FIG. 4 increases the boundary area between the jet 28 and the surrounding gaseous medium. It is obvious that the greater is the aforementioned boundary area defined by inner and outer surfaces $28_{int}$ and $28_{ext}$, the more efficient is the droplet formation mechanism. Therefore, it can be assumed that the double-sided jet 28 shown in FIG. 4 may be more efficient for cleaning as it will form a greater amount of droplets and will enhance stability of the droplets until they are delivered to the surface of the object.

Relationships between dimensions D, d, and t may depend on specific conditions, such as type of the cleaning medium M that is ejected from the nozzle onto the surface of the object (not shown in FIGS. 2 and 3), a distance from the jet exit opening 24 to the object, pressure of the medium M inside the nozzle 20, etc.

Figure 5:
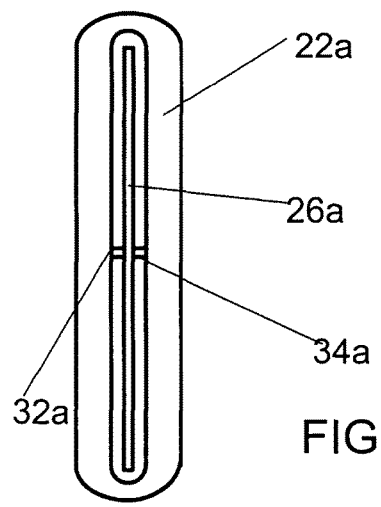
FIG. 5 is a front view of a slit-like nozzle of the invention.

The nozzle of the embodiment with the centrally arranged jet splitter is not limited to the round cross section shown in FIGS. 2-4, and the nozzle may have a slit-like cross section shown in FIG. 5 with a respective outer body 22a, plate-like beam jet splitter 26a, and splitter supporting ribs 32a and 34a. The nozzles of such a shape provide more uniform distribution of droplets over the surface of the treated object.

The tubular outer bodies 22, 22a and the jet splitters 26, 26a can be made from a corrosion-resistant material such as stainless steel.

Another embodiment of a jet nozzle with means for increasing the boundary surfaces between the jet of the cleaning medium and the surrounding atmosphere is a nozzle 40 shown in FIG. 6 which is a longitudinal sectional view of the nozzle. The nozzle 40 is comprised of a tubular body 42 that has a helical groove or grooves 44 formed on the inner surface of the tubular body 42. The groove may be a single or a multiple-threaded groove. FIG. 7 is a cross-sectional view along line VI-I of FIG. 6. Reference numeral 46 designates the inner surface of the tubular body, $D_1$ is the outer diameter of the tubular body 42, $d_1$ is the inner diameter of the tubular body, and $t_1$ is the depth of the groove ($t_1 = [D_1 - d_1]/2$).

Relationships between $d_1$, $t_1$, and the helix angle $\alpha_1$ (FIG. 6) may depend on specific operation conditions and a type of the medium ejected through the nozzle 40, but in general angle $\alpha_1$ may be within the range of 20° to 40°, the inner diameter $d_1$ of the tubular body 42 may be within the range of 1 to 2 mm, and depth $t_1$ of the grooves may be within the range of 0.2 to 0.5 mm. These ranges should not be construed as limiting the scope of other possible dimensions that may be selected with reference to specific application conditions.

The jet (not shown) on the exit from nozzle 40 also will have a diverging shape but the flows emitted from the helical grooves 44 will have directions determined by the helical angle $\alpha_1$, i.e., not only at an angle of divergence but also at a skewed angle with respect to the longitudinal axis. The skewed jets more effectively remove particles of contaminants from the surface of the flat object.

Figure 8:
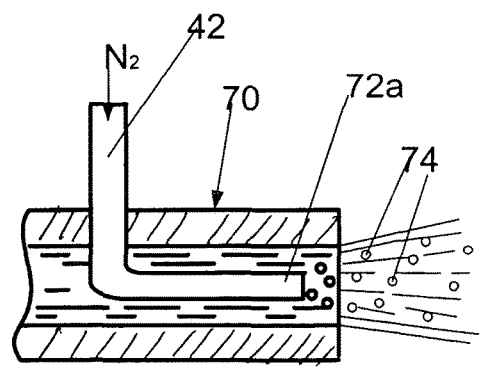
FIG. 8 is a longitudinal cross-sectional view of a nozzle of another embodiment with a gas supply tube inside the flow of the liquid through the nozzle.

Another embodiment of the nozzle of the invention with means for intensification of droplet formation is the one shown in FIG. 8. The device consists of a tubular nozzle 70 and a gas-supply tube 72 inserted into the nozzle at a distance from the jet outlet end 70a. The gas-supply tube 72 may have an L-shaped configuration with the gas outlet end 72a arranged coaxially with the direction of flow of the cleaning medium. The supply of gas under a pressure to the liquid cleaning medium generates bubbles 74 in the medium that increases the surface of discontinuity and thus enhances formation of droplets. The gas may be comprised of purified air, but preferable gas for this purpose is nitrogen. The gas-supply tube may have the inner diameter of 0.2 to 0.5 mm, and the nozzle 70 may have the inner diameter of about 1 to 2 mm. The nozzle and the gas-supply tube can be made, e.g., from stainless steel.

Having considered various embodiments of the nozzles, let us consider now the design of the cleaning unit as a whole. The cleaning unit that in general is designated by reference numeral 132 has been to some detail described in pending U.S. patent application Ser. Nos. 11/269,250 and 11/881,691 (now issued as U.S. Pat Nos. 9,799,536 and 9,275,849, respectively filed by the same applicant.

Figure 9:
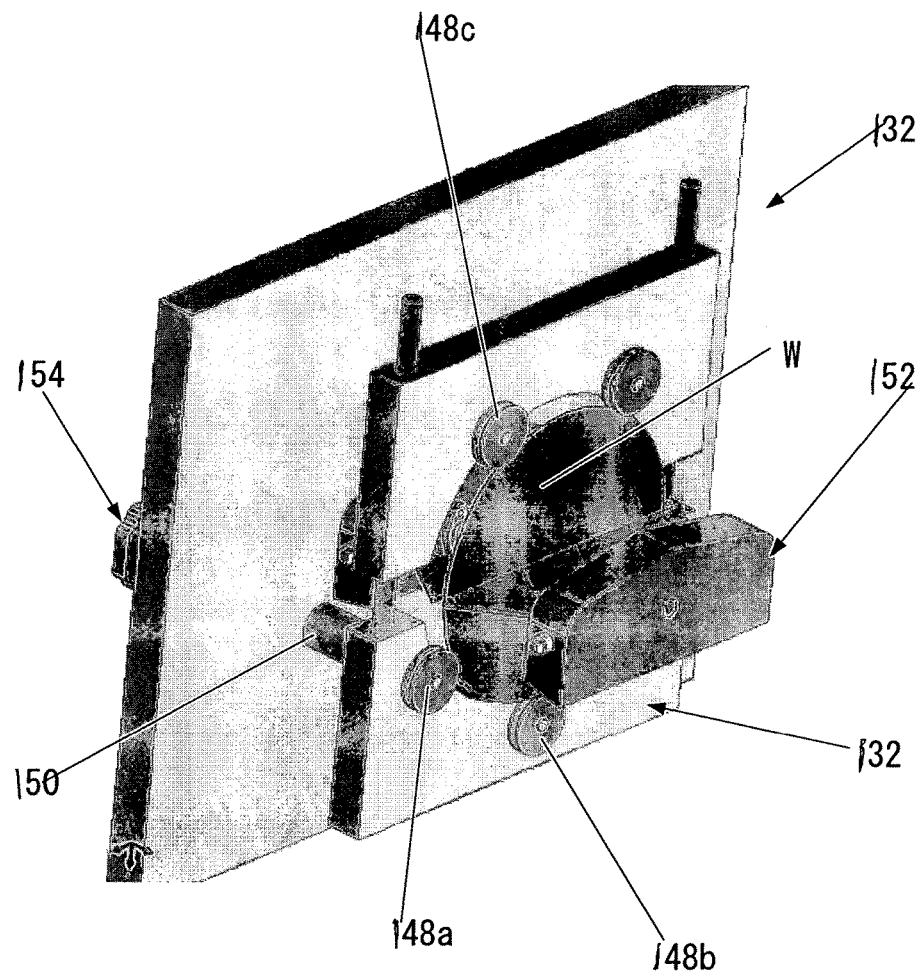
FIG. 9 is a three-dimensional view of a rapid pulse harmonic spray type cleaning unit of the invention.

The cleaning unit of the invention is designated as a whole by reference numeral 132 and is comprised of a rapid pulse harmonic spray type unit shown in a three-dimensional view in FIG. 9. The unit is normally enclosed in a sealed and filtered cabinet or enclosure (not shown) that may be comprised of a class 1 self-powered ULPA-filter cabinet. The cleaning unit 132 contains circumferentially arranged rollers 148a, 148b, 148c . . . , of which the roller 148a is a driving roller and the remaining rollers 148b, 148c, . . . are idler rollers. The drive roller 148a is driven from an adjustable-speed motor 150. The drive roller 148a and idler rollers 148b, 148c, . . . are arranged in such a way that there is always a minimal radial or edge contact and no surface contact along front or backside of the wafer W during processing/cleaning. The rapid pulse clean unit 132 has the head assembly 133 that holds the drive and idler rollers. The roller mechanism is mounted with different diameter rollers to hold semiconductor wafer of varying size from 75 mm to 300 mm and above. The upper part 133a of the head assembly is moveable in a vertical direction on guides 135a and 135b to provide insertion of the wafer W.

Figure 10:
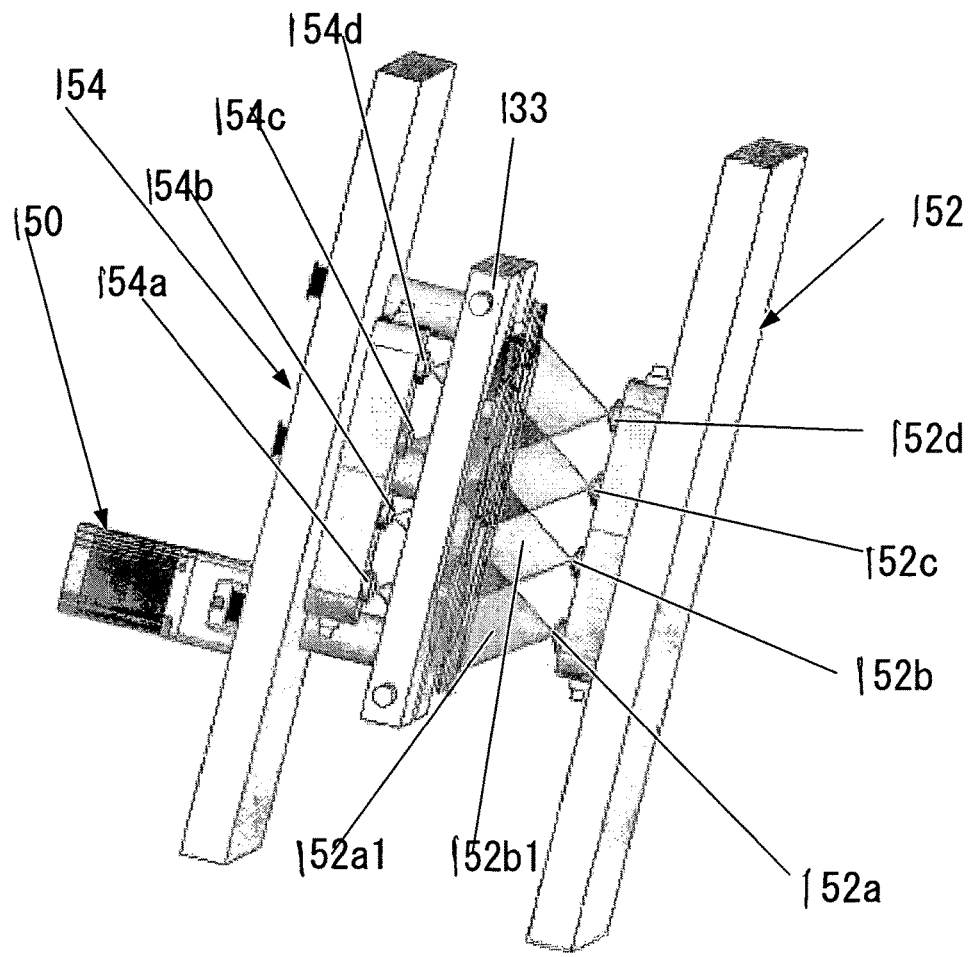
FIG. 10 is a three-dimensional view of the cleaning unit of the invention that shows arrangement of spray nozzles.

The chamber also contains stationary nozzle arrays 152 and 154 positioned on both sides of the vertical wafer W diametrically across the wafer W to clean the front and back surfaces of the wafer in a simultaneous process. The arrangement of the stationary nozzle arrays 152 and 154 is shown in FIG. 10. In the illustrated embodiment, each of the nozzle arrays contains four nozzles. Thus the nozzle array 152 contains nozzles 152a, 152b, 152c, and 152d, while the nozzle array 154 contains nozzles 154a, 154b, 154c, and 154d. The nozzles operate in so-called rapid pulse harmonic spray mode. In this mode, the nozzles inject discrete droplets of pulsed fluid streams of specific size selected to match a specific application.

Figure 13:
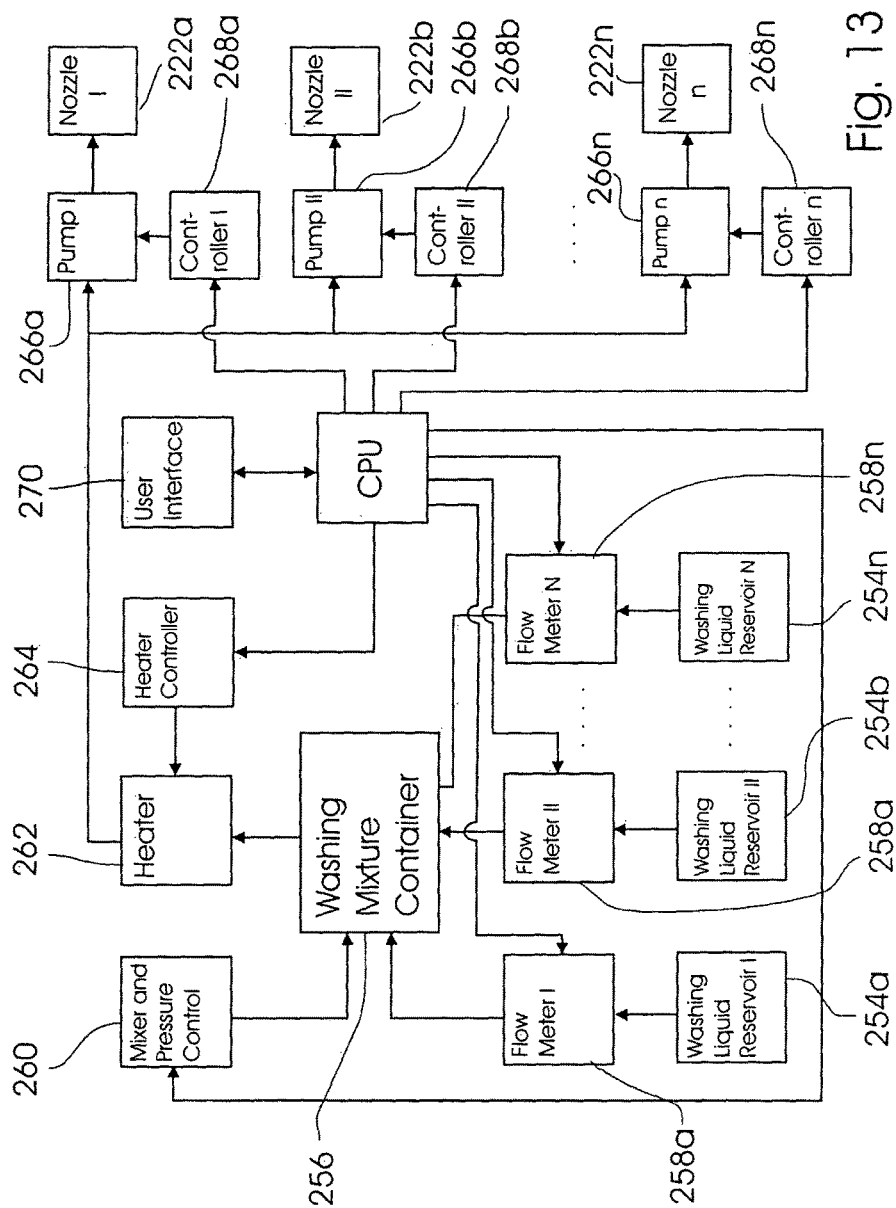
FIG. 13 is a hydraulic block-diagram of the cleaning unit with a plurality of identical nozzles.

The jets 152a1, 152b1 . . . 154c1, and 154d1 (FIG. 10) are created by means of hydraulic pumps, such as e.g., an electrical three-diaphragm short-piston pump. A hydraulic diagram of the cleaning unit, such as unit 232, is shown in FIG. 13. In the simplest case, the washing system may utilize a single-component liquid such as a deionized water, or other single-component liquids. In other cases, the washing liquid may be composed of several components and premixed prior to the delivery to the nozzles 222a, 222b, 222c, and 222d. The hydraulic diagram of FIG. 13 shows an example of a system that may selectively utilize a single-component or a multiple-component cleaning liquid. The hydraulic system contains reservoirs 254a, 254b, . . . 254n with different washing liquids such as deionized water, $H_2O_2$, alkalines, alcohols, etc. The reservoirs are provided with pressure control means (not shown).

Mixing is carried in a washing mixture container 256 with a stirrer (not shown) that is connected to the aforementioned reservoirs 254a, 254b, . . . 254n via respective flow meters 258a, 258b, . . . 258n. Mixing conditions and pressure in the container 256 are controlled by a mixing and pressure control unit 260. From the washing mixture container 256 the cleaning medium is sucked by pumps associated with respective nozzles 222a, 222b, . . . 222n. On its way to the nozzles the cleaning medium passes through the heater 262 controlled by a heater controller 264. Although four nozzles are shown in FIGS. 11 and 12, it is understood that the number of nozzles is not limited by four. Therefore, "n" pumps and "n" nozzle are shown in the hydraulic diagram of FIG. 13, although, if necessary, a single pump can be used for the supply of the cleaning medium to a plurality of the nozzle. However, the use of individual pumps for individual nozzles is preferable for reducing hydraulic losses and for reducing inertiality of the system. In FIG. 13, the pumps 266a, 266b, . . . 266n are connected to their respective nozzles 222a, 222b, . . . 222n. The pumps 266a, 266b, . . . 266n are controlled by their respective controllers 268a, 268b, . . . 268n. All controllers of the actuating mechanisms, such as stirrers, pumps, flow meters, etc. are connected to a central processing unit (CPU) that defines the operation sequences and operation modes. The input data are introduced into the CPU via a user interface 270.

In order to provide more uniform distribution of the cleaning medium ejected from the stationary nozzle onto the surface of the rotating wafer, the cleaning unit 232 may have an arrangement (FIG. 11) of nozzles of the slit type shown in FIG. 5. The nozzles 222a, 222b, 222c, and 222d are installed in a head assembly 233 and form a linear nozzle array that is arranged diametrically across the rotating wafer (see FIG. 12 which is a side view of the nozzle assembly of FIG. 11). The nozzles have a slit-like cross-section and may be nozzles of the type shown in FIG. 5 with the jet splitter 26a or may be without the jet splitter. It is advantageous to arrange the individual nozzles 222a, 222b, 222c, and 222d at a pitch that provides certain overlapping of the jet 252a, 252b, 252c, and 252d emitted from the respective nozzles onto the surface of the wafer W.

Figure 14:
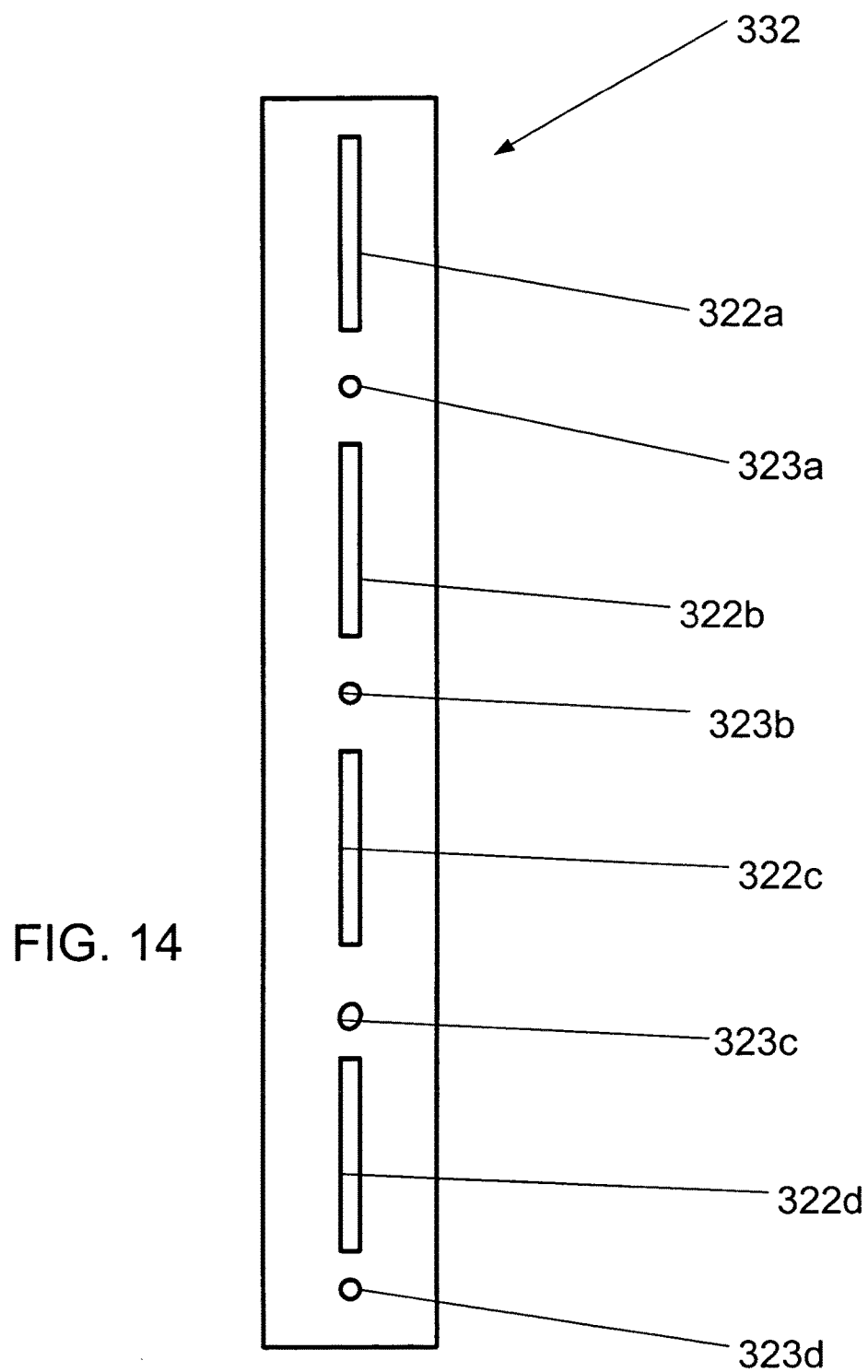
FIG. 14 is a front view of a cleaning unit made in accordance with still another embodiment wherein the turbulent-flow jet nozzles are arranged linearly in alternating sequence with laminar-flow nozzles.

FIG. 14 is a front view of a cleaning unit 332 made in accordance with still another embodiment wherein the turbulent-flow jet nozzles 322a, 322b, 322c, and 322d are arranged linearly in alternating sequence with laminar-flow nozzles 323a, 323b, 323c, and 323d. The laminar-flow nozzles 323a, 323b, 323c, and 323d create an essentially laminar flow of the liquid moving over the surface of the wafer for washing out the contaminant particles separated by the turbulent jets from the surface of the wafer W. The turbulent-flow jet nozzles and the laminar-flow nozzles may operate in alternating pulsed modes, or the laminar-flow nozzles may operate in a continuous mode. The laminar-flow nozzles 323a, 323b, 323c, and 323d may use a different cleaning medium.

Figure 15:
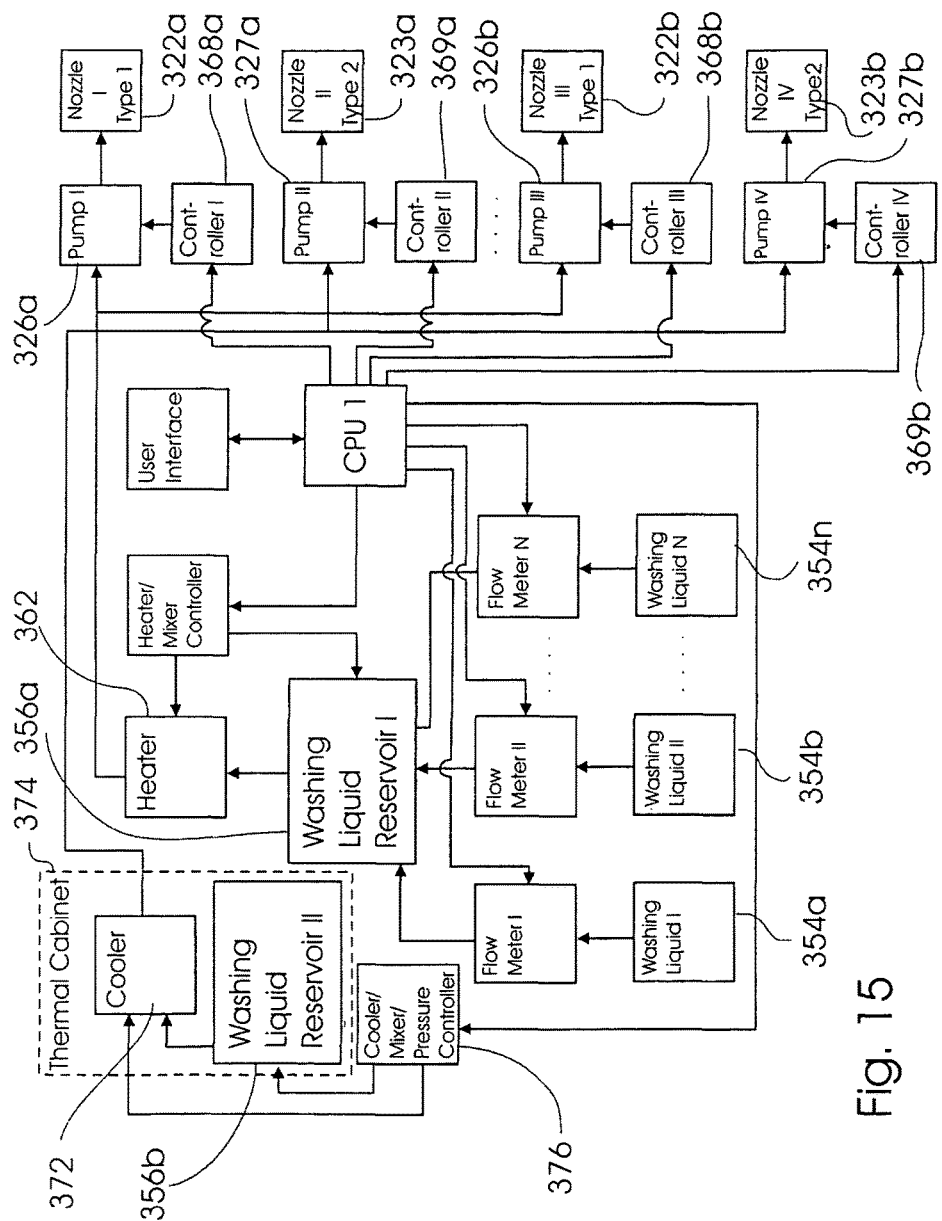
FIG. 15 is a hydraulic block-diagram of the cleaning unit of the type shown in FIG. 14.

A hydraulic diagram for the cleaning unit 332 is shown in FIG. 15 where parts and units that are similar to those shown in the diagram of FIG. 13 are designated by the same reference numeral with an addition of 100. For example, reservoirs for different washing liquids are designated as 354a, 354b, . . . 354n; the heater is designated by reference numeral 362, etc. Description of parts of the embodiment of FIG. 15 identical to those of FIG. 13 is omitted.

In distinction to the embodiment of FIG. 13, the system of FIG. 15 contains two washing liquid reservoirs 356a and 362b for the supply of different cleaning liquids to the turbulent flow nozzles (Type 1 Nozzles) 322a, 322b and laminar flow nozzles 323b (Type 2 Nozzles), respectively. Only two pairs of Type 1 Nozzles and Type 2 Nozzles are shown in order not to overcrowd the drawing. The nozzles are connected to the respective pumps 326a, 326b and 327a, 327b, via the controllers 368a, 368b and 369a, 369b, respectively.

Since some of the reservoirs 354a, 354b, . . . 354n may contain surfactants or other washing liquid components that can be more efficiently removed by cold water, the system of FIG. 15 incorporates a cooler 372 that together with the washing liquid reservoir 356b is placed into a thermally insulated cabinet 374. The cooler 372 is controlled by a respective controller 376. In addition to the functions prescribed to the CPU of the previous embodiment, the CPU1 of the system of FIG. 15 also defines the sequence of operation of the pumps for nozzles of the turbulent and laminar type, as well the operation mode of the cooler, and other additional components.

Figure 16:
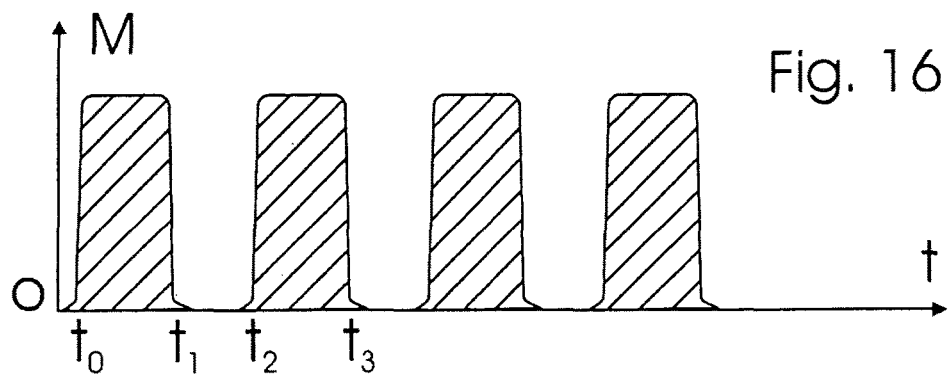
FIG. 16 is a diagram of the cleaning unit shown in FIGS. 11, 12, and 13.

An operation time diagram of the cleaning unit shown in FIGS. 11, 12, and 13 is shown in a graph of FIG. 16, where time is plotted on the abscissa axis, and the amount (mass) of the emitted liquid is plotted on the ordinate axis. It can be seen that liquid emission pulses ($t_0$–$t_1$, $t_2$–$t_3$, etc.) are interrupted by short time intervals, such as $t_1$–$t_2$, during which a current portion of the ejected liquid is completely removed from the rotating wafer W.

Figure 17A:
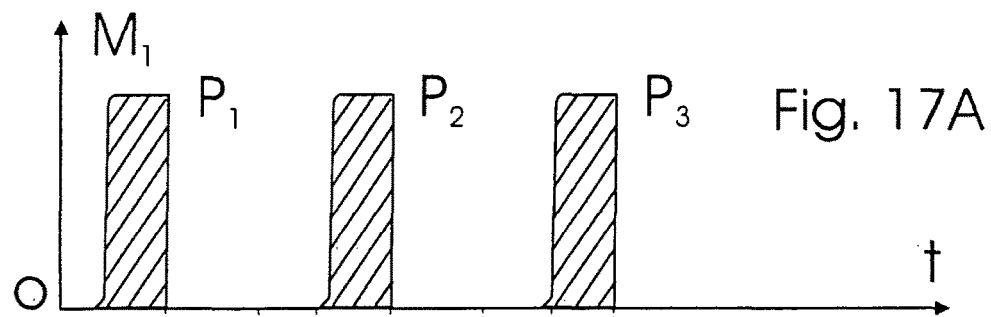
FIG. 17A is a time diagram that relates to the operation of the turbulent flow nozzles of the cleaning unit shown in FIG. 14.
Figure 17B:
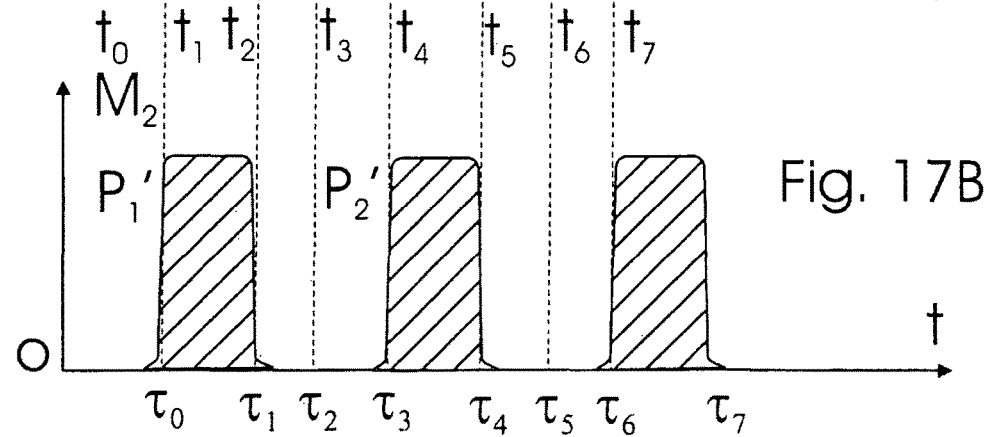
FIG. 17B is a time diagram that relates to the operation of the laminar flow nozzles of the cleaning unit shown in FIG. 14.

An operation time diagrams of the cleaning unit shown in FIGS. 14 and 15 is shown in graphs of FIGS. 17A and 17B, where time is plotted on the abscissa axis and the amount (mass) of the emitted liquid is plotted on the ordinate axis. FIG. 17A relates to the operation of the turbulent nozzles 322a, 322b, . . . , while FIG. 17B relates to operation of the laminar nozzles 323a, 323b, . . . etc. It can be seen that pulses $P_1^1$, $P_2^1$, etc., that are emitted through the laminar flow nozzles 323, 323, . . . follow immediately after the pulses $P_1$, $P_2$, etc., that are emitted through the turbulent flow nozzles 322a, 322b, . . . and that emissions of pulses $P_2$, $P_3$, etc., next after the pulses $P_1^1$, $P_2^1$, etc., are interrupted by short time intervals, such as $\tau_1$–$\tau_2$, $\tau_4$–$\tau_5$, etc., during which a current portion of the ejected liquid is completely removed from the rotating wafer W.

An important feature of the system of FIGS. 14 and 15 is that the liquids emitted though the turbulent flow nozzles and the laminar flow nozzles can be supplied at different temperatures that may have a temperature difference as high as 100° C. or higher. For example, the liquid in the turbulent flow may have a temperature close to the boiling point of the washing liquid, e.g., 80° C. At the same time, the liquid of the laminar flow may have a temperature close to 4° C.

Thus it has been shown that the invention provides a cleaning unit and a cleaning method for wet cleaning of flat objects with the use of a cleaning medium ejected from a system of nozzles in the form of a pulsed jets and impinged onto the surface of the wafer in the form of droplets having controlled kinetic energy and dimensions, wherein the nozzles are provided with droplet initiation means. The cleaning unit operates in a controllable mode that ensures most efficient removal of particles of contaminant as small as 0.1 µm or smaller. The cleaning unit and the method of cleaning provide more efficient cleaning by using different types of nozzles for separating contaminant particles and for washing out the separated particles from the wafer.

Although the invention has been shown and described with reference to specific embodiments, it is understood that these embodiments should not be construed as limiting the areas of application of the invention and that any changes and modifications are possible, provided that these changes and modifications do not depart from the scope of the attached patent claims. For example, the number of nozzles may be different from four nozzles shown in FIGS. 9, 10, 11, and 12.

The nozzle array body may have a form different from rectangular, e.g., round, oval, etc. The nozzles are not necessarily arranged in a line and may have cross-sections different from round and slit-like cross-sections. Objects other than semiconductor wafers can be cleaned with the device and by the method of the invention. A common single pump may supply a cleaning liquid to a group of simultaneously working nozzles. Mechanisms of other types can be used for rotating the object. The object may be stationary, and the head with nozzles may rotate relative to the object. Different pulse modes can be used and selected in accordance with specific operation conditions. The apparatus and method are applicable for cleaning not only flat objects but vertically-oriented objects of three-dimensional configurations, and the nozzles may be shifted axially for providing optimal distances to the areas to be cleaned.

The invention claimed is:

1. A pulsed jet cleaning unit to clean flat objects, such as semiconductor wafers, arranged in a vertical orientation with a pulsed liquid jet, the pulsed jet cleaning unit comprising:
 a group of jet spray nozzles configured to be coupled to a source of supply of at least one type of cleaning fluid, the at least one type of cleaning fluid to be supplied to the jet spray nozzles under pressure, the group of jet spray nozzles being configured to emit the at least one cleaning fluid through the jet spray nozzles in a pulsed mode to form pulsed jets, the pulsed jets configured to be impinged onto the flat objects in the form of droplets having controlled kinetic energy and dimensions;
 a pump hydraulically coupled to each of at least a group of the jet spray nozzles to supply the at least one type of cleaning fluid to the group of jet spray nozzles;
 a controller coupled to each pump to control an output of the controller-coupled pump;
 a processing unit electrically coupled to the controllers to define operational sequences and operational modes of the controllers;
 a flat object holding and driving mechanism to hold the flat objects and to move the flat objects in the vertical orientation relative to the jet spray nozzles, the flat objects being semiconductor substrates; and
 droplet formation enhancement means installed in the jet spray nozzles for enhancing discontinuity of the pulsed jets and forming droplets of the cleaning fluid, the formed droplets each having an approximate pre-calculated amount of kinetic energy and approximate physical dimensions, the pre-calculated amount of kinetic energy being based on a mass of the formed droplets and a velocity of the formed droplets, the mass of the formed droplet being pre-calculated to have a mass approximate to a particle to be removed from the flat object.

2. The pulsed jet cleaning unit of claim 1, wherein each of the group of jet spray nozzles has a jet exit end and wherein the droplet formation enhancement means includes jet splitters installed in the center of each of the jet spray nozzles near the jet exit end.

3. The pulsed jet cleaning unit of claim 2, wherein the jet sputters have a bullet-shaped body having a sharp end directed opposite to the jet exit end.

4. The pulsed cleaning unit of claim 1, wherein the nozzles are arranged along a line substantially across an entire diameter of each of the flat objects on a side of the flat objects that faces the jet spray nozzles.

5. The pulsed jet cleaning unit of claim 1, wherein the jet spray nozzles have at least one cross section selected from cross-sections consisting of round cross sections and slit-like cross sections.

6. The pulsed jet cleaning unit of claim 1, wherein the jet spray nozzles are arranged along a line substantially across an entire dimension of each of the flat objects on a side of the flat objects that faces the jet spray nozzles.

7. The pulsed jet cleaning unit of claim 6, wherein the jet spray nozzles have at least one cross section selected from cross-sections consisting of round cross sections and slit-like cross sections.

8. The pulsed jet cleaning unit of claim 1, wherein each of the jet spray nozzles has a longitudinal axis, a jet exit end, and an inner surface and wherein the droplet formation enhancement means includes at least one curvilinear groove formed in the inner surface to change a direction of the pulsed jet at jet exit end relative to longitudinal axis.

9. The pulsed jet cleaning unit of claim 8, wherein the curvilinear groove is a helical groove.

10. The pulsed jet cleaning unit of claim 1, wherein the cleaning fluid is a liquid, each of the jet spray nozzles has a jet exit end, and wherein a gas supply tube is introduced into each of the jet spray nozzles at a distance from the jet exit end, and wherein the droplet formation enhancement means includes a gas supply tube installed in each of the jet supply nozzles at a distance from the jet exit end for forming gas bubbles in the pulsed jet as means for enhancing a formation of droplets.

11. The pulsed jet cleaning unit of claim 1, wherein the jet spray nozzles generate turbulent flows and wherein the pulsed jet cleaning unit further comprises a group of additional nozzles configured to eject a cleaning fluid in the form of laminar flows, the additional nozzles being arranged in the line in an alternating order with the jet spray nozzles.

12. The pulsed jet cleaning unit of claim 1, further comprising a hydraulic system including at least one reservoir to contain the at least one type of cleaning fluid.

13. The pulsed jet cleaning unit of claim 11, further comprising a hydraulic system that includes a plurality of reservoirs to contain a different cleaning fluid, an individual hydraulic pump for each of the jet spray nozzles and for each of the group of additional nozzles, at least one of the jet spray nozzles and at least one of the group of additional nozzles being configured to receive different cleaning fluids from the plurality reservoirs; the pulsed jet cleaning unit further comprising a control mechanism configured to control the jet spray nozzles and the group of additional nozzles to operate in an alternating mode with pulses of emission of the different cleaning fluids and with selected time intervals between pulses of the jet spray nozzles and at least one of the group of additional nozzles.

14. The pulsed jet cleaning unit of claim 13, wherein the hydraulic system further includes a cooler and a heater, and wherein the control mechanism is configured to supply different temperatures for the cleaning fluids to the jet spray nozzles and the group of additional nozzles.

\* \* \* \* \*

UNITED STATES PATENT AND TRADEMARK OFFICE
CERTIFICATE OF CORRECTION

| | |
|---|---|
| PATENT NO. | : 10,179,351 B2 |
| APPLICATION NO. | : 11/299134 |
| DATED | : January 15, 2019 |
| INVENTOR(S) | : Rubinder Randhawa |

Page 1 of 1

It is certified that error appears in the above-identified patent and that said Letters Patent is hereby corrected as shown below:

On the Title Page

In item (75), in "Inventor", in Column 1, Line 1, delete "Fremont," and insert --Dublin,-- therefor In the Claims In Column 14, Line 7, in Claim 3, delete "sputters" and insert --splitters-- therefor In Column 14, Line 9, in Claim 4, after "pulsed", insert --jet--

In Column 14, Line 58, in Claim 13, after "plurality", insert --of--

Signed and Sealed this
Tenth Day of March, 2020

Andrei Iancu
*Director of the United States Patent and Trademark Office*